(12) United States Patent
Drillet et al.

(10) Patent No.: US 10,697,052 B2
(45) Date of Patent: Jun. 30, 2020

(54) HIGH STRENGTH STEEL AND PRODUCTION METHOD

(71) Applicant: ArcelorMittal, Luxembourg (LU)

(72) Inventors: Josee Drillet, Rozerieul (FR); Veronique Hebert, Saint Julien Metz (FR)

(73) Assignee: ArcelorMittal, Luxembourg (LU)

( * ) Notice: Subject to any disclaimer, the term of this patent is extended or adjusted under 35 U.S.C. 154(b) by 80 days.

(21) Appl. No.: 15/735,337

(22) PCT Filed: Jun. 9, 2016

(86) PCT No.: PCT/IB2016/000780
§ 371 (c)(1),
(2) Date: Dec. 11, 2017

(87) PCT Pub. No.: WO2016/198940
PCT Pub. Date: Dec. 15, 2016

(65) Prior Publication Data
US 2018/0171459 A1    Jun. 21, 2018

(30) Foreign Application Priority Data

Jun. 10, 2015  (WO) .................. PCT/IB2015/000891

(51) Int. Cl.
*C23C 2/02*        (2006.01)
*C23C 14/02*       (2006.01)
(Continued)

(52) U.S. Cl.
CPC .............. *C23C 2/02* (2013.01); *B32B 15/013* (2013.01); *C21D 8/0226* (2013.01);
(Continued)

(58) Field of Classification Search
None
See application file for complete search history.

(56) References Cited

U.S. PATENT DOCUMENTS

| 6,159,312 A | 12/2000 | Koo et al. |
| 9,493,865 B2 | 11/2016 | Kami et al. |

(Continued)

FOREIGN PATENT DOCUMENTS

| EP | 2123786 A1 | 11/2009 |
| EP | 2426230 A1 | 3/2012 |

(Continued)

OTHER PUBLICATIONS

See Corresponding International Search Report PCT/IB2016/000780.

*Primary Examiner* — Jenny R Wu
(74) *Attorney, Agent, or Firm* — Davidson, Davidson & Kappel, LLC

(57) ABSTRACT

The present invention provides a cold-rolled and annealed steel sheet of thickness between 0.7 mm and 2 mm, mechanical strength ranging from 1180 MPa to 1320 MPa, wherein the hole expansion ratio Ac % is greater than 20% and the bending angle is greater than or equal to 40°. The chemical composition includes, the contents being expressed as weight percent: $0.09\% \leq C \leq 0.11\%$, $2.6\% \leq Mn \leq 2.8\%$, $0.20\% \leq Si \leq 0.55\%$, $0.25\% \leq Cr < 0.5\%$, $0.025\% \leq Ti \leq 0.040\%$, $0.0015\% \leq B \leq 0.0025\%$, $0.005\% \leq Al \leq 0.18\%$, $0.08\% \leq Mo \leq 0.15\%$, $0.020\% \leq Nb \leq 0.040\%$, $0.002\% \leq N \leq 0.007\%$, $0.0005\% \leq S \leq 0.005\%$, $0.001\% \leq P \leq 0.020\%$, $Ca \leq 0.003\%$, the remainder being iron and inevitable impurities resulting from processing. The sheet has a microstructure including martensite or lower bainite. A sum of the surface fractions of martensite and lower is between 40% and 70%, from 15% to 45% of the surface fraction is low-carbide bainite, from 5% to less than 20% of the surface fraction is ferrite, the non-recrystallized ferrite fraction relative to the total ferrite fraction is less than 15%, and less than 5% of the surface fraction of residual austenite is in the form of islands. The (Continued)

fraction of former austenitic grains in which the size is less than at least one micrometer represents 40% to 60% of the total population of the former austenitic grains.

21 Claims, 2 Drawing Sheets

(51) Int. Cl.
| | |
|---|---|
| *C23C 2/06* | (2006.01) |
| *C23C 2/28* | (2006.01) |
| *C23C 2/40* | (2006.01) |
| *C22C 38/38* | (2006.01) |
| *C22C 38/32* | (2006.01) |
| *C22C 38/28* | (2006.01) |
| *C22C 38/26* | (2006.01) |
| *C22C 38/22* | (2006.01) |
| *C22C 38/06* | (2006.01) |
| *C22C 38/02* | (2006.01) |
| *C22C 38/00* | (2006.01) |
| *C21D 8/02* | (2006.01) |
| *B32B 15/01* | (2006.01) |
| *C21D 8/04* | (2006.01) |
| *C21D 9/46* | (2006.01) |
| *C21D 9/48* | (2006.01) |

(52) U.S. Cl.
CPC ......... *C21D 8/0236* (2013.01); *C21D 8/0247* (2013.01); *C21D 8/0273* (2013.01); *C21D 8/0426* (2013.01); *C21D 8/0436* (2013.01); *C21D 8/0447* (2013.01); *C21D 8/0473* (2013.01); *C22C 38/001* (2013.01); *C22C 38/002* (2013.01); *C22C 38/02* (2013.01); *C22C 38/06* (2013.01); *C22C 38/22* (2013.01); *C22C 38/26* (2013.01); *C22C 38/28* (2013.01); *C22C 38/32* (2013.01); *C22C 38/38* (2013.01); *C23C 2/06* (2013.01); *C23C 2/28* (2013.01); *C23C 2/40* (2013.01); *C23C 14/02* (2013.01); *C21D 9/46* (2013.01); *C21D 9/48* (2013.01); *C21D 2211/002* (2013.01); *C21D 2211/005* (2013.01); *C21D 2211/008* (2013.01)

(56) References Cited

U.S. PATENT DOCUMENTS

| | | | |
|---|---|---|---|
| 2004/0241336 A1* | 12/2004 | Brisberger | ............... C23C 2/14 427/431 |
| 2010/0003538 A1* | 1/2010 | Nikolov | .................. B05D 1/62 428/626 |
| 2011/0048589 A1 | 3/2011 | Matsuda et al. | |
| 2011/0168300 A1 | 7/2011 | Moulin et al. | |
| 2012/0040203 A1* | 2/2012 | Takagi | ................ C21D 8/0405 428/577 |
| 2012/0132327 A1 | 5/2012 | Mukai et al. | |
| 2012/0312433 A1 | 12/2012 | Mizuta et al. | |
| 2013/0209833 A1 | 8/2013 | Scott et al. | |
| 2016/0222486 A1 | 8/2016 | Moulin et al. | |
| 2016/0312326 A1 | 10/2016 | Drillet et al. | |
| 2016/0312329 A1 | 10/2016 | Hasegawa et al. | |

FOREIGN PATENT DOCUMENTS

| | | |
|---|---|---|
| EP | 2578718 A1 | 4/2013 |
| EP | 2716782 A1 | 4/2014 |
| JP | 2003253385 A | 9/2003 |
| JP | 2007119842 A | 5/2007 |
| JP | 2007177272 A | 7/2007 |
| JP | 2012180594 A | 9/2012 |
| JP | 2015117404 A | 6/2015 |
| RU | 2234542 C2 | 8/2004 |
| RU | 2493284 C2 | 9/2013 |
| RU | 2535890 C2 | 12/2014 |
| WO | 20100130871 A1 | 11/2010 |
| WO | WO2013144376 A1 | 10/2013 |
| WO | 2015087224 A1 | 6/2015 |
| WO | 2015185956 A1 | 12/2015 |

* cited by examiner 20 nm 50 nm

HIGH STRENGTH STEEL AND PRODUCTION METHOD

The invention relates to a cold-rolled and annealed steel sheet having very high mechanical strength and deformability for manufacturing shaped parts, in particular in the automotive industry, for manufacturing automobile body structural elements, and for manufacturing such a sheet.

BACKGROUND

Steels having a very favorable yield strength/resistance ratio during forming operations have been developed.

They have a very high consolidation capacity, which results in good distribution of deformations in the event of a collision and a much higher yield strength of the part after forming. Thus, it is possible to produce complex parts as with conventional steels, but with higher mechanical properties, which results in reduced thickness that still meets the same functional specifications. These steels are thus an effective response to demands for vehicle weight reduction and safety.

In particular, steels wherein the structure comprises martensite, and potentially bainite, within a ferritic matrix, have undergone extensive development because they combine high strength with high deformation potential.

Recent demands for lighter weight and lower energy consumption have increased the demand for very high-strength steels wherein the mechanical strength $R_m$ is greater than 1180 MPa.

In addition to this high strength level, these steels must have good ductility, weldability, and coatability, in particular good suitability for continuous hot dip galvanizing.

These steels must also have high yield strength and elongation at break as well as good formability.

Indeed, some automotive parts are manufactured by shaping operations that combine various deformation methods. Certain microstructural characteristics of steel can be well suited to one deformation method, but not to another. Certain portions of the parts must have high elongation resistance and/or good bendability and/or stretch flangeability, in particular for shaping curved edges.

This stretch flangeability is evaluated by determining a hole expansion ratio, denoted $Ac\%$. This ratio measures the ability of the steel to expand during cold stamping and therefore provides an assessment of the formability for this deformation method.

The hole expansion ratio can be evaluated as follows: after making a hole by cutting a hole into a metal sheet, a tapered tool is used to expand the edges of this hole. It is during this operation that early damage can be observed near the edges of the hole during expansion, with this damage starting on second phase particles or at the interfaces between the various microstructural components of the steel.

According to documents US 2012/0312433 A1 and US 2012/132327 A1, steels in which the mechanical strength $R_m$ is greater than 1180 MPa are known. However, this mechanical strength is achieved at the expense of formability and weldability.

Furthermore, according to documents US 2013/0209833 A1, US 2011/0048589 A1, US 2011/01683000 A1 and WO 2013/144376 A1, steels having a high mechanical strength exceeding 1000 MPa are known, but do not simultaneously have satisfactory formability and weldability.

SUMMARY OF THE INVENTION

Under these conditions, an object of the invention is to supply a steel sheet having a high mechanical strength, in particular between 1180 MPa and 1320 MPa, together with a high yield strength, in particular between 750 MPa and 970 MPa, this value being determined before any skin-pass operation on the sheet, a good formability, in particular a hole expansion ratio $Ac\%$ greater than or equal to 20%, a bending angle greater than or equal to 40° for a sheet of thickness between 0.7 mm and 2 mm, and an elongation at break greater than 7%.

The present invention provides a cold-rolled and annealed steel sheet having a thickness between 0.7 mm and 2 mm, a mechanical strength between 1180 MPa and 1320 MPa, wherein the hole expansion ratio $Ac\%$ is greater than 20% and the bending angle is greater than or equal to 40°, the chemical composition comprising, the contents being expressed as weight percent: $0.09\% \leq C \leq 0.11\%$, $2.6\% \leq Mn \leq 2.8\%$, $0.20\% \leq Si \leq 0.55\%$, $0.25\% \leq Cr < 0.5\%$, $0.025\% \leq Ti \leq 0.040\%$, $0.0015\% \leq B \leq 0.0025\%$, $0.005\% \leq Al \leq 0.18\%$, $0.08\% \leq Mo \leq 0.15\%$, $0.020\% \leq Nb \leq 0.040\%$, $0.002\% \leq N \leq 0.007\%$, $0.0005\% \leq S \leq 0.005\%$, $0.001\% \leq P \leq 0.020\%$, $Ca \leq 0.003\%$, the remainder being iron and inevitable impurities arising from processing, the sheet having a microstructure comprising martensite and/or lower bainite, said martensite comprising fresh martensite and/or auto-tempered martensite, the sum of the surface fractions of martensite and lower bainite being between 40% and 70%, from 15% to 45% of the surface fraction of low-carbide bainite, and from 5% to at least 20% of the surface fraction of ferrite, the ratio of the non-recrystallized ferrite to the total ferrite fraction being less than 15%, and at least 5% as a residual austenite surface fraction in the form of islands, the fraction of former austenitic grains in which the size is less than at least one micrometer representing 40% to 60% of the total population of said former austenitic grains.

In some embodiments, the sheet according to the invention also includes one or more of the following characteristics:

- the microstructure comprises, in surface fraction, from 15% to 45% fresh martensite.
- the microstructure comprises, in surface fraction, from 5% to 50% of the sum of auto-tempered martensite and lower bainite.
- the auto-tempered martensite and said lower bainite contain carbides in the form of rods oriented in directions <111> of the martensitic and bainitic laths.
- the low-carbide bainite contains fewer than 100 carbides per 100 square micrometer unit of surface area.
- the steel sheet contains precipitates of the type (Ti, Nb, Mo)(C, N) of less than 5 nanometers in size, present in an amount of less than 10,000 precipitates/$\mu m^3$
- the chemical composition comprises, the content being expressed as weight percent: $2.6\% \leq Mn \leq 2.7\%$.
- the chemical composition preferably comprises, the content being expressed as weight percent: $0.30\% \leq Si \leq 0.5\%$.
- according to a preferential embodiment, the chemical composition comprises, the content being expressed as weight percent: $0.005\% \leq Al \leq 0.030\%$.
- the sheet is coated with zinc or zinc alloy, achieved by dipping.
- according to a particular embodiment, the zinc or zinc alloy coating is a galvanized-alloy coating, the zinc or zinc alloy coating comprising from 7 wt-% to 12 wt-% iron.
- the steel sheet has a zinc or zinc alloy coating, obtained by vacuum deposition.

The invention also provides a cold-rolled and annealed sheet, coated with zinc or zinc alloy, according to any of the hereinabove characteristics, comprising the following sequential steps:

a semi-finished product is supplied, wherein the chemical composition comprises, the contents being expressed as weight percent: 0.09%≤C≤0.11%, 2.6%≤Mn≤2.8%, 0.20%≤Si≤0.55%, 0.25%≤Cr<0.5%, 0.025%≤Ti≤0.040%, 0.0015%≤B≤0.0025%, 0.005%≤Al≤0.18%, 0.08%≤Mo≤0.15%, 0.020%≤Nb≤0.040%, 0.002%≤N≤0.007%, 0.0005%≤S≤0.005%, 0.001%≤P≤0.020%, Ca≤0.003%, the remainder being iron and inevitable impurities arising from processing, then the semi-finished product is heated to a temperature $T_r$ greater than or equal to 1250° C., then the semi-finished product is hot-rolled, the finish temperature of the rolling being greater than the temperature Ar3 at which austenitic transformation starts during cooling, in order to obtain a hot-rolled sheet, then the hot-rolled sheet is cooled at a rate greater than 30° C./s to prevent the formation of ferrite and pearlite, then the hot-rolled sheet is coiled at a temperature between 580° C. and 500° C., then the hot-rolled sheet is cold rolled to obtain a cold-rolled sheet, then the cold-rolled sheet is re-heated, between 600° C. and Ac1, Ac1 denoting the temperature at which austenitic transformation starts during heating, with a re-heating rate $V_C$ between 1° C./s and 20° C./s, the cold-rolled sheet is brought to a temperature Tm between 780° C. and (Ac3-25° C.) and the cold-rolled sheet is held at the temperature Tm for a period of time Dm between 30 seconds and 150 seconds, it being understood that Ac3 denotes the finish temperature of austenitic transformation during heating, then the sheet is cooled at a rate VR1 between 10° C./s and 150° C./s to a temperature Te between 400° C. and 490° C., then the sheet is held at the temperature Te for a period of time De between 5 seconds and 150 seconds, then the sheet is coated by continuous immersion in a zinc or zinc alloy bath at a temperature TZn between 450° C. and 480° C., said temperatures Te and TZn being such that 0° C.≤(Te−TZn)≤10° C., so as to obtain a coated sheet, then the coated sheet is optionally re-heated to a temperature $T_G$ between 490° C. and 550° C. for a period $t_G$ between 10 s and 40 s.

The invention also provides a method for manufacturing a cold-rolled and annealed sheet, comprising the following sequential steps:

a semi-finished product is supplied, wherein the chemical composition comprises, the contents being expressed as weight percent: 0.09%≤C≤0.11%, 2.6%≤Mn≤2.8%, 0.20%≤Si≤0.55%, 0.25%≤Cr<0.5%, 0.025%≤Ti≤0.040%, 0.0015%≤B≤0.0025%, 0.005%≤Al≤0.18%, 0.08%≤Mo≤0.15%, 0.020%≤Nb≤0.040%, 0.002%≤N≤0.007%, 0.0005%≤S≤0.005%, 0.001%≤P≤0.020%, Ca≤0.003%, the remainder being iron and inevitable impurities arising from processing, then the semi-finished product is heated to a temperature $T_r$ greater than or equal to 1250° C., then the semi-finished product is hot-rolled, the finish temperature of the rolling process being greater than Ar3, to obtain a hot-rolled sheet, then the hot-rolled sheet is cooled at a rate greater than 30° C./s to prevent the formation of ferrite and pearlite, then the hot-rolled sheet is coiled at a temperature between 580° C. and 500° C., then the hot-rolled sheet is cold rolled to obtain a cold-rolled sheet, then the cold-rolled sheet is re-heated at a re-heating rate VR, between 600° C. and Ac1, with Ac1 denoting the temperature at which austenitic transformation starts during heating, between 1° C./s and 20° C./s, then the cold-rolled sheet is heated to a temperature Tm between 780° C. and (Ac3-25° C.) and the cold-rolled sheet is held at the temperature Tm for a period of time Dm between 30 seconds and 150 seconds, it being understood that Ac3 denotes the finish temperature of austenitic transformation during heating, then the sheet is cooled at a rate VR2 between 10° C./s and 100° C./s to a temperature Te between 400° C. and 490° C., then the sheet is held at the temperature Te for a period of time De between 5 seconds and 150 seconds, then the sheet is cooled to room temperature.

In particular embodiments, the method also comprises one or more of the following characteristics:

in addition, a zinc or zinc alloy coating is applied by vacuum deposition after the step of cooling to room temperature.

vacuum deposition is carried out by physical vapor deposition (PVD).

vacuum deposition is carried out by Jet Vapor Deposition (JVD).

BRIEF DESCRIPTION OF THE DRAWINGS

Other characteristics and advantages of the invention, which will appear during the description below, are given by way of example and made in reference to the attached appended figures, in which.

DETAILED DESCRIPTION

Figure 1:
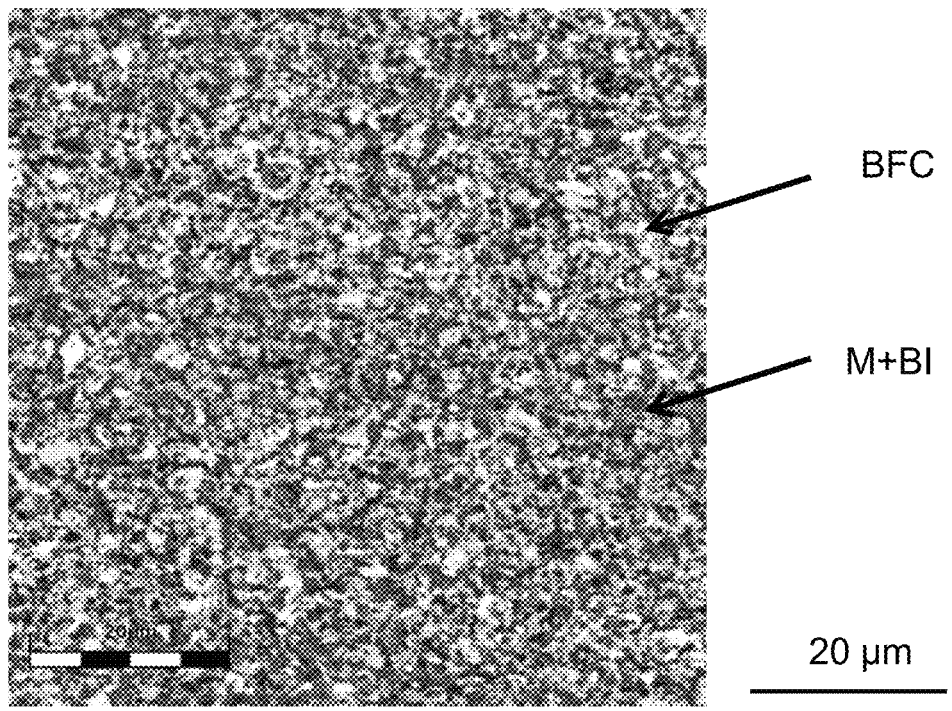
FIG. 1 shows the microstructure of a steel sheet according to the invention, demonstrated by a first type of metallographic etching.

Ac1 is also used to denote the temperature at which allotropic transformation starts during heating of the steel.

Ac3 refers to the finish temperature of austenitic transformation during heating.

Ar3 refers to the temperature at which austenitic transformation starts during cooling.

Ms denotes the temperature at which martensitic transformation starts.

The microstructure of the sheet according to the invention includes martensite. This is the result of a diffusion-free transformation of austenite γ below the start temperature of martensitic transformation during cooling.

Martensite has the form of a thin lath elongated in one direction and oriented within each initial grain of austenite. The term martensite includes both fresh and auto-tempered martensite. A distinction is made between auto-tempered martensite and fresh martensite, i.e., not tempered and not auto-tempered.

In particular, auto-tempered martensite has the form of thin laths comprising iron carbides dispersed in these laths, in the form of rods oriented in directions <111> of the mesh a' of the laths. This auto-tempered martensite is formed by precipitation of iron carbides below the martensitic transformation temperature Ms when cooling is not slow enough to produce fresh martensite. Conversely, fresh martensite does not contain carbides.

Bainite, formed during cooling from the austenitic temperature range, above the initial temperature Ms of the martensitic transformation, is formed as an aggregate of ferrite laths and cementite particles. Its formation involves short distance diffusion.

Consequently, a distinction is made between lower bainite and low-carbide bainite. Lower bainite is formed during cooling in a temperature range immediately above the martensitic transformation temperature Ms. It has the form of thin laths and includes carbides dispersed within these laths.

In addition, low-carbide bainite is defined as a bainite containing fewer than 100 carbides per 100 square micrometer unit of surface area. Low-carbide bainite is formed between 550° C. and 450° C. during cooling. Unlike low-carbide bainite, lower bainite always contains more than 100 carbides per 100 square micrometer unit of surface area.

In the chemical composition of the steel of the invention, carbon plays a role in the formation of the microstructure and on the mechanical properties.

The carbon content in weight percent ranges from 0.09% to 0.11%. This range of carbon content contributes to simultaneously achieving a mechanical strength greater than 1180 MPa, an elongation at break greater than 7%, and a satisfactory hole expansion ratio Ac % greater than or equal to 20%. In particular, a carbon content of less than 0.09% does not enable sufficient mechanical strength to be achieved. For a higher carbon content, greater than 0.11%, the weldability tends to decrease and the temperature Ms is lowered, so that the fraction of fresh martensite in the microstructure tends to increase and thus diminish the hole expansion ratio.

The manganese content in weight percent is between 2.6% and 2.8%. Manganese is a gammagenic element that lowers the temperature Ac3 and the temperature Ms at which martensite formation starts. The low carbon content of the steel could result in a high temperature Ac3 above 860° C. A manganese content greater than 2.6%, by decreasing the temperature Ac3, enables the achievement of complete austenization of the steel between 840° C. and 855° C., after holding at this temperature for at least 30 s. Manganese also promotes the formation of auto-tempered martensite and thus contributes to a hole expansion ratio Ac % greater than or equal to 20%. The manganese content in weight percent is limited to 2.8% in order to limit the formation of banded structures, and preferably between 2.6% and 2.7%.

Silicon is a solid solution hardening element of which the content in weight percent in steel is between 0.20 wt-% and 0.55 wt-%, preferably between 0.30% and 0.5%. A content of at least 0.30% enables sufficient hardening of the ferrite and/or the bainite. The silicon content in weight percent is limited to 0.55% to ensure a hole expansion ratio Ac % greater than or equal to 20%, limiting the formation of upper bainite. In addition, an increase in silicon content diminishes the coatability of the steel by promoting the formation of adherent oxides on the surface of the sheet. A silicon content of less than 0.55% also contributes to good weldability.

Silicon is an alphagenic element and contributes to raising the temperature Ac3 and promotes the formation of low-carbide bainite. A silicon content less than 0.55% helps to prevent the formation of an excessive amount of low-carbide bainite.

The composition of the steel sheet also comprises chromium in an amount greater than or equal to 0.25 wt-%, in order to improve the hardenability of the steel, and to increase its hardness and mechanical strength. The chromium content must be less than 0.5%, in order to maintain a satisfactory elongation at break and to limit manufacturing costs.

Titanium is present in steel in amounts ranging from 0.025 wt-% to 0.040 wt-%. In amounts ranging from 0.025% to 0.040%, titanium is combined with nitrogen and carbon to precipitate in the form of nitrides and/or carbonitrides. Below 0.025%, there is a risk that the mechanical strength of 1180 MPa will not be achieved.

Above a titanium content of 0.040%, there is a risk that coarse titanium nitrides will be precipitated from the liquid state, which tends to reduce ductility and result in early damage during hole expansion. In fact, when nitrides larger than 6 micrometers are present, the majority of these nitrides are found to cause debonding with the matrix during cutting and stamping steps. Titanium also ensures that nitrogen is fully combined in the form of hardening precipitation, so that boron is found in free form and can play an effective role in hardenability. Titanium is in a superstoichiometric amount relative to nitrogen, thus the Ti/N ratio is greater than 3.42.

The boron content in weight percent is between 0.0015% and 0.0025%. By limiting the activity of carbon, boron enables diffusive phase transformations (ferritic or pearlitic transformation during cooling) to be controlled and limited and to form hardening phases (bainite or martensite) necessary to obtain high mechanical resistance characteristics. The addition of boron also limits the addition of hardening elements such as Mn, Mo, and Cr and reduces the analytical cost of the steel grade. According to the invention, the minimum boron content to ensure effective hardenability is 0.0015%. Above 0.0025%, the effect on hardenability is saturated and there is an adverse effect on coatability and ductility.

The composition of the steel sheet also includes molybdenum, in an amount from 0.08 wt-% to 0.15 wt-%. Molybdenum, like chromium, plays an effective role on hardenability, at a content greater than 0.08%.

A molybdenum content greater than 0.15% delays the recrystallization of ferrite. The mechanical strength Rm is then too high, greater than 1320 MPa, which both result in a reduction in ductility.

When the annealing temperature is lower than (Ac3-25° C.), an addition under the conditions of the invention makes it possible to obtain, in combination with titanium and niobium, nanometric precipitation of molybdenum, titanium and niobium carbonitrides (Ti, Nb, Mo)(C, N) which contributes to hardening and makes it possible to obtain a mechanical strength Rm greater than or equal to 1180 MPa after annealing.

However, excessively dense precipitation of small size compounds results in excessive hardening: when the density of precipitates smaller than 5 nanometers exceeds 10,000 precipitates/μm$^3$, the mechanical strength Rm may exceed 1320 MPa and the cold deformability becomes insufficient.

An addition of molybdenum in an amount specified in the invention makes it possible to obtain a steel sheet that is less sensitive to possible fluctuations in the steps following annealing at temperature Tm. Although the cooling rate VR and the temperature Te are continuously controlled under industrial conditions according to defined setpoints, a slight fluctuation in these parameters can sometimes occur transiently. These fluctuations should not affect the characteristics of the final product. Within the range defined by the invention, moderate fluctuations in VR or Te, for example 7%, result in a variation in mechanical strength Rm of less than 7%.

The chemical composition of the hot-rolled steel sheet contains niobium, with a content in weight percent between 0.020% and 0.040%. In amounts greater than 0.020%, niobium makes possible an increase in mechanical strength Rm. Above a content in weight percent of 0.040%, the recrystallization of austenite is delayed. The structure thus contains a significant fraction of elongated grains, which no longer results in achievement of the target hole expansion ratio Ac %.

In addition, the nitrogen content in weight percent is between 0.002% and 0.007%. In order to form a sufficient amount of nitrides and carbonitrides, the nitrogen content must be greater than 0.002%. The nitrogen content should be less than 0.007% in order to prevent boron nitride precipitation, which would reduce the amount of free boron.

An aluminum content between 0.005 wt-% and 0.18 wt-% serves to deoxidize the steel during its manufacture. The aluminum content must be less than 0.18% or even less than 0.030% to prevent an increase in the temperature Ac3 and the formation of ferrite during cooling.

The sulfur content must be less than 0.005%. Above this content, ductility is reduced due to the excessive presence of sulfides such as MnS which decrease the deformability, in particular the hole expansion ratio Ac %. Obtaining extremely reduced sulfur content, less than 0.0005%, is, however, very expensive, with no significant advantage in terms of production costs. From a practical point of view, a sulfur content of at least 0.0005% can be selected.

The phosphorus content must be less than 0.020%. Phosphorus is an element that confers hardening in solid solution but reduces spot-weldability and hot ductility, particularly because of its propensity to segregate at grain joints or to co-segregate with manganese.

Achieving an extremely low phosphorus content of less than 0.001% is nevertheless very expensive, with no significant advantage in terms of manufacturing costs. From a practical point of view, a phosphorus content of at least 0.001% can be selected.

In an amount of less than 0.003%, calcium prevents elongated inclusions, in particular sulfides, which adversely affect ductility.

In the microstructure of the steel sheet according to the invention, the sum of the surface fractions of martensite and lower bainite is between 40% and 70%. The microstructure also contains, in surface fraction, 15% to 45% low-carbide bainite, 5% to less than 20% ferrite, and less than 5% residual austenite in the form of islands. The surface fraction of non-recrystallized ferrite of the total ferrite fraction is less than 15%, which makes it possible to obtain simultaneously a mechanical strength Rm between 1180 MPa and 1320 MPa, an elongation greater than 7%, and a hole expansion ratio greater than or equal to 20%.

As noted above, a distinction is made between auto-tempered martensite and fresh martensite, i.e., not tempered and not auto-tempered.

According to one embodiment, the martensite is formed from auto-tempered martensite, with the surface percentage of the sum of the auto-tempered martensite and the lower bainite representing at least 5% of the total microstructure, up to 50%.

Auto-tempered martensite and lower bainite have the form of thin laths, and include carbides dispersed in these laths. In particular, auto-tempered martensite and lower bainite include $Fe_2C$ and $Fe_3C$ iron carbides in the form of rods oriented in directions <111> of the mesh of the martensitic and bainitic laths. The percentages of auto-tempered and lower martensite are specified together, as both auto-tempered and lower martensite have substantially the same role on the usage properties of steel. In addition, these two components, in the form of thin laths, cannot be individually distinguished from each other in scanning electron microscopy observations. These two components can be distinguished only through transmission electron microscopy examinations.

A surface percentage of the sum of auto-tempered martensite and lower bainite between 40% and 70% facilitates the formability of steel, in particular its bendability and stretch flangeability. A percentage of auto-tempered martensite and lower bainite of at least 40% thus contributes to a satisfactory bending angle, in particular a bending angle for sheets of thickness between 0.7 mm and 2 mm, of at least 40°, and a hole expansion ratio Ac % greater than or equal to 20%.

The percentage of the sum of auto-tempered martensite and lower bainite in the microstructure must be less than 70% to maintain a sufficient percentage of low-carbide bainite, resulting in an elongation at break of at least 7%.

Martensite can also include fresh martensite in a percentage between 15% and 45% of the total microstructure, and the percentage of fresh martensite must be less than 45%, in particular to prevent reducing the ductility of the steel and to ensure a good hole expansion ratio.

The microstructure also comprises, in surface fraction, from 15% to 45% low-carbide bainite. It is formed during cooling after annealing at temperature Tm, and during holding between 550° C. and 450° C. Its formation is favored by the addition of silicon, which tends to delay the precipitation of carbides, together with a small amount of hardening elements such as carbon or manganese.

Low-carbide bainite increases elongation at break. In particular, a surface percentage of low-carbide bainite of at least 15% makes it possible to obtain an elongation at break of at least 7%. The surface percentage of bainite with low-carbide content should be limited to 45% to ensure a hole expansion ratio greater than or equal to 20% and a mechanical strength greater than or equal to 1180 MPa.

The microstructure also includes from 5% to less than 20% ferrite per unit area. If the ferrite content is less than 5%, there is a risk of obtaining excess auto-tempered martensite with insufficient yield strength. If the ferrite content exceeds 20%, there is a risk that the mechanical strength Rm will be less than 1320 MPa.

The microstructure can also contain up to 5%, in surface fraction, of residual austenite in the form of islands, forming small plates between the laths of auto-tempered martensite and lower bainite.

In addition, the inventors also demonstrated the importance of control of the size of the austenitic grains created during annealing of cold-rolled sheet metal, i.e., which existed at high temperatures after annealing, before subsequent cooling. These austenitic grains are referred to as "former austenitic grains" because these grains are replaced by other components during allotropic transformation during cooling. As will be explained, the size of these former austenitic grains can nevertheless be demonstrated by various methods, in the final product. According to the invention, the fraction of former austenitic grains in which the size is less than one micrometer, represents between 40% and 60% of the total population of these former austenitic grains The fraction of former austenitic grains in which the size is less than one micrometer is determined, for example, by means of an appropriate reagent, for which the etching rate depends on certain local segregations at the former joints, such as the Béchet-Beaujard reagent, known per se. To this end, a sample of steel in the final state, i.e., at the end of the manufacturing method according to the invention, is etched by an appropriate reagent, in particular a reagent comprising a saturated aqueous solution of picric acid with at least 0.5% sodium alkyl sulfonate added, for a period between a few minutes and one hour.

At the end of this etching, a micrographic examination of the sample makes it possible to visualize the joints of the former austenitic grains, and to create a histogram of the distribution of the size of these former austenitic grains, in particular to determine the fraction of the former austenitic grains in which the size is less than one micrometer.

Alternatively, the size of the former austenitic grains can be determined by means of an interrupted quench during cooling after annealing, by adopting initial cooling conditions so as to induce intergranular ferritic nucleation, and then to interrupt it by quenching.

The inventors have demonstrated that the size of these former austenite grains affects the kinetics of phase transformation during cooling after annealing. In particular, small austenitic grains, smaller than one micrometer, contribute to lowering the value of the temperature Ms and thus increase the formation of fresh martensite.

Conversely, the presence of coarse austenitic grains reduces the formation of low-carbide bainite.

A fraction of former austenitic grains, in which the size is less than one micrometer, between 40% and 60% of the total austenitic grain population, contributes to lowering the temperature Ms of the martensitic transformation, to prevent the formation of an excessive proportion of auto-tempered martensite and lower bainite, which would reduce the elongation at break and the yield point.

The microstructural characteristics presented hereinabove are determined, for example, by observing the microstructure through Scanning Electron Microscopy using a field effect gun (SEM-FEG technique) at a magnification greater than 1200×, coupled with an Electron Backscatter Diffraction (EBSD) detector. The morphologies of the laths and grains are then determined by image analysis using known software, such as Aphelion® software.

The steel sheet that is cold-rolled and annealed according to the invention can be produced untreated, without a coating, and it can also have a coating. For example, such a coating may be zinc or zinc alloy, particularly a galvanized-alloy coating comprising from 7 wt-% to 12 wt-% iron.

In particular, such a steel sheet is well suited for the deposition of a metal coating, particularly by means of hot dip galvanizing according to the usual methods. In particular, the composition and mechanical characteristics of the steel are compatible with the constraints and thermal cycles of coating methods for continuous dipping in a zinc bath.

The coating method used depends on the intended application. In particular, the coating can be obtained by hot-dip, vacuum deposition technique such as Jet Vapor Deposition (JVD), or cationic electroplating.

The inventors have demonstrated that a steel sheet according to the invention has a mechanical strength between 1180 MPa and 1320 MPa, together with a yield strength between 750 MPa and 970 MPa, before any skin-pass operation, an elongation at break of at least 7%, in particular greater than 8%, and a hole expansion ratio Ac % of at least 20%.

In particular, a yield strength between 800 MPa and 970 MPa is obtained while maintaining a mechanical strength less than 1320 MPa. In addition, such a sheet has a high bending angle. In particular, when the sheet has a thickness between 0.7 mm and 2 mm, the bending angle is at least 40°.

The implementation of a manufacturing method for a sheet rolled according to the invention involves the following steps:

A steel is supplied having the composition according to the invention and a semi-finished product is cast from it. This casting can be carried out in ingots or continuously in slabs with a thickness of about 200 mm.

The semi-finished castings are first heated to a temperature $T_R$ greater than 1250° C. in order to homogenize the steel and completely dissolve the precipitates.

The semi-finished product is then hot-rolled in a temperature range where the steel structure is completely austenitic, i.e., at a temperature $T_{FL}$ greater than the temperature Ar3 at which austenitic transformation starts during cooling. If the temperature $T_{FL}$ is lower than the temperature Ar3, the ferrite grains are work-hardened by rolling and the ductility is reduced. Preferentially, a temperature at the end of a rolling greater than 875° C. should be selected.

The hot-rolled sheet is cooled at a rate greater than 30° C./s to prevent the formation of ferrite and pearlite, then the hot-rolled sheet is coiled at a temperature $T_{Bob}$ between 500° C. and 580° C. The coiling temperature must be lower than 580° C. to prevent oxidation during coiling. If the coiling temperature is too low, i.e., less than 500° C., the hardness of the steel increases, which increases the stress required for subsequent cold rolling. The coiling temperature range also prevents the formation of pearlite.

The sheet is then pickled by using one of the well-known methods.

Cold rolling is then carried out, with a reduction rate e.g., between 40% and 70%, in order to introduce a deformation amount that enables subsequent recrystallization.

The cold-rolled sheet is then heated, preferably in a continuous annealing plant, with an average heating rate $V_C$ between 1° C./s and 20° C./s, between 600° C. and temperature Ac1 (temperature at which austenite starts its allotropic transformation during heating).

The temperature Ac1 can be measured by dilatometry, or evaluated by means of the following formula published in "Darstellung der Umwandlungen für technische Anwendungen and Möglichkeiten ihrer Beeinflussung," H. P. Hougardy, Werkstoffkunde Stahl Band 1, 198-231, Verlag Stahleisen, Düsseldorf, 1984:

$$Ac1=739-22*C-7*Mn+2*Si+14*Cr+13*Mo-13*Ni.$$

In this formula, temperature Ac1 is expressed in degrees Celsius, and the elemental contents of the composition are expressed as weight percent.

When the steel is heated between 600° C. and Ac1, a recrystallization process starts and (TiNbMo)(CN) precipitates are formed that control the size distribution of the austenitic grains formed starting at Ac1. Surprisingly, the inventors have demonstrated that the control of the average heating rate $V_C$ between 600° C. and Ac1 and thus the heating time between 600° C. and Ac1, which corresponds to the time between the start of recrystallization and the start of phase transformation, is decisive for the kinetics of subsequent phase transformations, especially during the step of holding the annealing temperature Tm. The inventors have thus demonstrated, unexpectedly, that the choice of an average heating rate $V_C$ between 600° C. and Ac1 comprised between 1° C./s and 20° C./s makes it possible, at the end of the manufacturing process, to obtain a steel in which the microstructure is made up, in surface fraction, of 40% to 70% in sum of martensite and lower bainite, 15% to 45% of low-carbide bainite, 5% to less than 20% ferrite, and less than 5% residual austenite in the form of islands.

In particular, an average heating rate $V_C$ less than 1° C./s would result in an excessively long heating time between 600° C. and Ac1, which would result in excess ferrite formation and too low mechanical resistance.

Conversely, an average heating rate $V_C$ greater than 20° C./s would result in an insufficient heating time between 600° C. and Ac1, and in insufficient growth of ferritic grains during heating between 600° C. and Ac1.

Thus, the inventors have demonstrated that the size of ferritic grains obtained after heating between 600° C. and Ac1 has an influence on the size of austenite grains after austenization. Insufficient growth of ferritic grains results in the formation of an excessively large fraction of austenite grains, which results in an insufficient formation of auto-tempered martensite after annealing, i.e., less than 40%, due to the lowering of the value of the temperature Ms.

The cold-rolled sheet is then heated from temperature Ac1 to an annealing temperature Tm between 780° C. and (Ac3−25° C.).

The temperature Ac3 can be measured by dilatometry or calculated according to the formula: Ac3=912−370−27.4 Mn+27.3Si−6.35 Cr−32.7 Ni+95.2 V+190Ti+72 Al+64.5 Nb+5.57 W+332 S+276 P+485 N−900B+16.2 C Mn+32.3 C Si+15.4 C Cr+48 C Ni+4.32 Si Cr−17.3 Si Mo−18.6 Si Ni+4.8 Mn Ni+40.5 Mo V+174 $C^2$+2.46 $Mn^2$−6.86 $Si^2$+ 0.322 $Cr^2$+9.9 $Mo^2$+1.24 $Ni^2$−60.2 $V^2$.

In this formula, the temperature Ac3 is expressed in degrees Celsius, and the elemental contents of the composition are expressed in weight percent.

When the temperature $T_m$ is less than 780° C., the density of precipitate (Ti, Nb, Mo)(CN) is such that the hardening can lead to an increase of Rm above the value of 1320 MPa and to lower formability.

When the temperature $T_m$ is greater than (Ac3−25° C.), the austenitic grain size increases excessively so that an excess amount of lower bainite and martensite is formed, to the detriment of fresh martensite and it is thus impossible to achieve a mechanical strength Rm of 1180 MPa.

The cold-rolled sheet is held at a temperature Tm for a period of time Dm between 30 second and 150 seconds.

The period of time Dm is selected such that the fraction of austenitic grains in which the size is less than one micrometer represents from 40% to 60% of the total austenitic population. A holding time Dm of less than 30 s would result in the formation of an excessive proportion of ferrite at the end of the process. The size of the austenitic grains determines the phase transformation kinetics during the cooling following annealing. In particular, small austenitic grains, smaller than one micrometer, contribute to lowering the value of the temperature Ms and thus reducing the formation of auto-tempered martensite.

Heating the cold-rolled sheet at an average heating rate $V_C$ between 1° C./s and 20° C./s to a temperature between 600° C. and temperature Ac1, followed by heating the cold-rolled sheet between Ac1 and Tm and holding the cold-rolled sheet at the temperature Tm for the period of time Dm between 50 seconds and 100 seconds thus makes it possible to control the size of the austenite grains formed, and more particularly to control the fraction of these grains wherein the size is less than at least one micrometer.

These heating parameters make it possible for the microstructure according to the invention to be obtained at the end of annealing and thus contribute to obtaining the desired mechanical characteristics.

In the case of a sheet intended to be galvanized subsequently, the steel sheet is then cooled at a rate $V_{R1}$ between 10° C./s and 150° C./s to a temperature Te between 400° C. and 490° C. The cooling rate must be greater than 10° C./s in order to form less than 5% ferrite and not to form excess low-carbide bainite.

In the case of manufacturing a bare sheet, the steel sheet is cooled at a rate VR2 between 10° C./s and 100° C./s to a temperature Te between 400° C. and 490° C.

Cooling can be carried out starting from temperature Tm in one or more steps and can involve various cooling methods such as cold or boiling water baths, water jets or gas jets.

The sheet is then held at the temperature Te for a period of time De between 5 seconds and 150 seconds.

A partial transformation of austenite to low-carbide bainite occurs at this step. The holding at Te must be less than 150 s so as to limit the surface fraction of bainite and thus obtain a sufficient proportion of martensite.

The following steps of the method differ depending on whether a continuous galvanized steel sheet is fabricated, in particular galvanized-alloyed or uncoated.

According to a first embodiment, corresponding to manufacturing a continuously galvanized steel sheet, the sheet is coated by continuous immersion in a zinc or zinc alloy bath at a temperature TZn between 450° C. and 480° C. for a few seconds. Temperatures Te and TZn are such that 0° C.≤(Te−TZn)≤10° C.

The galvanized product is then cooled to room temperature while a large fraction of the remaining austenite is transformed to fresh martensite and/or lower bainite.

If a cold-rolled, annealed, and galvanized-alloyed ("galvannealed") steel sheet is to be manufactured, the galvanized product is heated immediately after leaving the zinc or zinc alloy bath at a temperature $T_G$ between 490° C./s and 550° C. for a period of time $t_G$ between 10 seconds and 40 seconds. This causes the diffusion of iron and the thin layer of zinc or zinc alloy deposited during the immersion process, resulting in a galvanized-alloyed sheet.

The galvanized-alloyed sheet is then cooled to room temperature while a large fraction of the remaining austenite is transformed to fresh martensite and/or lower bainite.

In a second embodiment, corresponding to manufacturing an uncoated steel sheet, cooling of the sheet is carried out from temperature Te to the ambient temperature.

In a third embodiment, corresponding to manufacturing a steel sheet coated by a vacuum process, one proceeds as in the second embodiment, the sheet is cooled from temperature Te to room temperature, then a zinc or zinc alloy coating is achieved by vacuum deposition, e.g., by a physical vapor deposition (PVD) or a Jet Vapor Deposition (JVD).

In all the embodiments described above, a cold-rolled and annealed steel sheet containing in surface fraction 40% to 70% of the total amount of martensite and lower bainite, 15% to 45% low-carbide bainite, 5% to less than 20% ferrite and less than 5% residual austenite in the form of islands is obtained.

The inventors have demonstrated that the use of this method makes it possible to obtain a steel sheet with a mechanical strength between 1180 MPa and 1320 MPa, together with a yield strength between 750 MPa and 970 MPa (before any skin-pass operation), an elongation at break of at least 7% or even 8%, wherein the hole expansion ratio Ac % is greater than or equal to 20%.

In addition, the use of this method ensures that the sheet can be bent at least 40° when the thickness of the sheet is between 0.7 mm and 2 mm.

The sheet obtained is also suitable for welding by means of conventional joining methods such as resistance spot welding.

By way of non-exhaustive examples, the following results will show the advantageous characteristics conferred by the invention.

Semi-finished steel products have been supplied, wherein the compositions, expressed as weight percent (%) are shown in Table 1 below.

In addition to steels I1 to I3 used for manufacturing sheets according to the invention, for purposes of comparison the composition of steels R1 to R5 used for manufacturing reference sheets is indicated.

The temperature Ac3 was measured by dilatometry, or calculated using the above formula and reported in Table 1.

TABLE 1

Steel Compositions - Temperature Ac3

|    | C %   | Mn %  | Si %  | Cr %  | Ti %  | B %    | Al %  | Mo %  | Nb %  | N %   | S %   | P %   | Ca %   | Ac3 (° C.) |
|----|-------|-------|-------|-------|-------|--------|-------|-------|-------|-------|-------|-------|--------|------------|
| I1 | 0.099 | 2.67  | 0.384 | 0.294 | 0.031 | 0.0018 | 0.127 | 0.088 | 0.024 | 0.004 | 0.003 | 0.015 | <0.003 | 853        |
| I2 | 0.09  | 2.69  | 0.313 | 0.3   | 0.028 | 0.002  | 0.153 | 0.09  | 0.024 | 0.004 | 0.003 | 0.010 | <0.003 | 855        |
| I3 | 0.107 | 2.69  | 0.338 | 0.3   | 0.035 | 0.002  | 0.133 | 0.09  | 0.025 | 0.007 | 0.003 | 0.015 | <0.003 | 844        |
| R1 | 0.134 | 2.515 | 0.536 | 0.574 | 0.043 | 0.0045 | 0.017 | 0.002 | 0.031 | 0.006 | 0.003 | 0.015 | <0.003 | 838        |
| R2 | 0.086 | 2.492 | 0.309 | 0.519 | 0.040 | 0.0039 | 0.028 | 0.003 | 0.028 | 0.005 | 0.003 | 0.015 | <0.003 | 830        |
| R3 | 0.087 | 2.584 | 0.310 | 0.520 | 0.039 | 0.0038 | 0.025 | 0.003 | 0.034 | 0.005 | 0.003 | 0.015 | <0.003 | 830        |
| R4 | 0.079 | 2.52  | 0.251 | 0.310 | 0.022 | 0.002  | 0.150 | 0.09  | 0.024 | 0.004 | 0.003 | 0.010 | <0.003 | 853        |
| R5 | 0.117 | 2.245 | 0.507 | 0.515 | 0.029 | 0.0035 | 0.029 | 0.002 | 0.018 | 0.005 | 0.003 | 0.015 | <0.003 | 830        |

Underlined values: not according to the invention.

Semi-finished castings corresponding to the hereinabove compositions were heated to a temperature $T_R$ greater than 1250° C., then hot-rolled, the temperature at the end of rolling being 850° C., greater than Ar3 for all these steels.

The hot-rolled sheets were cooled while preventing the formation of ferrite and pearlite, then coiled at a temperature 545° C. The sheets were then cold-rolled to a thickness of 1.4 mm.

In a first set of tests, I1 sheets were then heated at a heating rate $V_C$, between 600° C. and Ac1, Ac1 denoting the temperature at which austenitic transformation starts during heating, then again from Ac1 to the temperature Tm and held at a temperature Tm for a period of time Dm.

The sheets were cooled at a rate $V_{R1}$ to a temperature Te, then held at the temperature Te for a period of time De.

In a particular test (I1F), sheet I1 was heated to 810° C., held for 120 s at this temperature, then cooled by water quenching at a rate greater than 100° C./s to room temperature, i.e., without the step of holding at the temperature Te.

These tests were performed under various treatment conditions (A to H) as shown in Table 2. In this table, "n.a." means: not applicable. Indeed, in treatment F, there was no holding at a temperature Te, thus making it impossible to define a relevant holding time De.

In a second set of tests, grades R1-R5 were treated under the conditions defined in Table 3.

The sheets manufactured under all the hereinabove conditions were then coated with a coating by continuous hot-dip in a zinc bath at 460° C. and immediately heated to 510° C. so as to obtain a galvanized-alloyed coating.

TABLE 2

Test conditions for Grade I1.

| Treatment | $V_C$ between 600 and Ac1 (° C./s) | Tm (° C.) | Dm (s) | $V_{R1}$ (° C./s) | Te (° C.) | De (s) |
|-----------|------------------------------------|-----------|--------|-------------------|-----------|--------|
| A | 2   | 810 | 120 | 30         | 460 | 130  |
| B | 2   | 830 | 120 | 30         | 460 | 130  |
| C | 6   | 820 | 60  | 26         | 470 | 33   |
| D | 0.2 | 810 | 2   | 26         | 460 | 33   |
| E | 0.2 | 810 | 60  | 26         | 460 | 33   |
| F | 2   | 810 | 120 | >100° C./s | 20  | n.a. |
| G | 2   | 780 | 2   | 26° C./s   | 460 | 33   |
| H | 2   | 760 | 120 | 18         | 470 | 100  |

Underlined values: not in accordance with the invention

TABLE 3

Test conditions for grades I2, I3, and R1 to R5

| Treatment | $V_C$ between 600 and Ac1 (° C./s) | Tm (° C.) | Dm (s) | $V_{R1}$ (° C./s) | Te (° C.) | De (s) |
|-----------|------------------------------------|-----------|--------|-------------------|-----------|--------|
| A | 2 | 810 | 120 | 30 | 460 | 130 |
| B | 2 | 830 | 120 | 30 | 460 | 130 |
| C | 6 | 820 | 60  | 26 | 470 | 33  |
| I | 8 | 805 | 50  | 30 | 470 | 40  |
| J | 2 | 780 | 140 | 18 | 460 | 120 |

The mechanical characteristics of the sheets thus obtained were determined, resulting from the steel composition and the heat treatment. By convention, the sheets were named by combining the names of the chemical composition and the heat treatment: thus I1A refers to the sheet obtained from composition I1 to which the conditions of heat treatment A have been applied.

Tensile strength tests were used to determine the yield strength Re, tensile strength Rm, and total elongation At of the sheets obtained by these various manufacturing methods. The bending ability of these sheets was also determined by determining the maximum angle before fracture.

This angle is determined by applying a punch to the sheets so as to bend them. The force applied to achieve bending increases until fracture occurs. The measurement of the force applied during bending thus makes it possible to detect the initiation of the sheet fracture and to measure the maximum bending angle when this fracture occurs.

The hole expansion ratio Ac % was also determined for each sheet by making a 10 mm diameter hole in the sheet by cutting through the sheet, then using a tapered tool to expand the edges of the hole. As described in ISO 16630:2009, the initial diameter Di of the hole before stamping and the final diameter Df of the hole after stamping were measured at the moment cracks started to appear in the thickness of the sheet at the edges of the hole. The expansion capacity of the hole Ac % was determined according to the following formula:

$$Ac\ \% = 100 * \frac{D_f - D_i}{D_i}.$$

Microstructural characteristics of the steels were also determined. The surface fractions of martensite (including auto-tempered martensite and fresh martensite) and lower bainite (jointly), auto-tempered martensite and lower bainite (jointly), and low-carbide bainite were quantified on polished sections subjected to sodium bisulfate etching. The surface fraction of fresh martensite was quantified after etching by a NaOH—NaNO3 reagent.

The surface fraction of ferrite was also determined using optical and scanning electron microscopy observations in which the ferritic phase was identified.

The nature, size, and density of thin-film precipitates were also observed through transmission electron microscopy.

Details relating to the microstructures of the sheet are shown in Table 4 below.

The mechanical properties of the sheet are shown in Table 5 below.

TABLE 5

Mechanical properties of the sheets obtained

| | Re (MPa) | Rm (MPa) | At (%) | Bending angle (°) | Ac % |
|---|---|---|---|---|---|
| I1A | 793 | 1210 | 7.5 | 57 | 20 |
| I1B | 803 | <u>1166</u> | 8 | n.d. | 25 |
| I1C | 803 | 1253 | 9.5 | 60 | n.d. |
| I1D | <u>621</u> | <u>1063</u> | 9.2 | n.d. | 25 |
| I1E | <u>636</u> | <u>1069</u> | 9.2 | n.d. | 25 |
| I1F | <u>1054</u> | 1370 | <u>6.7</u> | n.d. | 37 |
| I1G | 756 | 1237 | 10.1 | n.d. | <u>18</u> |
| I1H | 856 | 1327 | 7.5 | n.d. | <u>15.</u> |
| I2J | 763 | 1206 | 11 | 25 | 22 |
| I3I | 770 | 1270 | 8.1 | 44 | 21 |
| R1B | 930 | <u>1353</u> | 7.3 | 56 | 43.9 |
| R2B | 800 | <u>1116</u> | 8 | 71 | n.d. |
| R3B | 821 | <u>1131</u> | 7.6 | 56 | n.d. |
| R3C | 798 | <u>1165</u> | 8.6 | n.d. | 37 |
| R4J | <u>669</u> | <u>1095</u> | 13.4 | 63 | 28 |
| R5B | 790 | <u>1151</u> | <u>6.7</u> | 63 | n.d. |
| R5C | <u>720</u> | <u>1137</u> | 10.4 | n.d. | 30 | n.d.: not determined

The relationships among steel compositions, their microstructure, and their mechanical properties are thus demonstrated.

Steel sheets according to the invention have a composition and a microstructure that makes it possible to obtain a mechanical strength, a yield strength, an elongation at break, a bending angle, and a hole expansion ratio that satisfy the target values.

Figure 2:
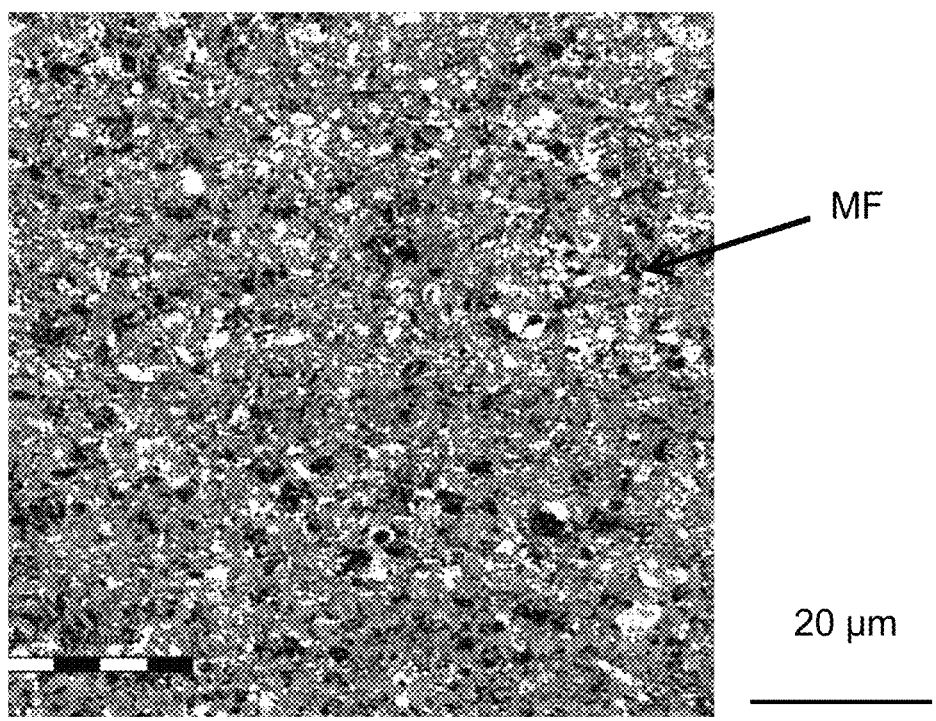
FIG. 2 shows the microstructure of the steel sheet in FIG. 1, demonstrated by a second type of metallographic etching.

FIGS. 1 and 2 illustrate the microstructure of example I1A. FIG. 1 shows the result of using sodium bisulfite to etch a sheet, while FIG. 2 shows the result of using NaOH—NaNO3 to etching a sheet. FIG. 1 shows auto-tempered

TABLE 4

Microstructural characteristics of the sheets obtained

| | (Martensite + lower bainite) (%) | (Auto-tempered martensite + lower bainite) (%) | Fresh martensite (%) | Low-carbide bainite (%) | Austenite (%) | Ferrite (%) | Fraction of austenitic grains Size <1 micron | Density of (Ti,Nb,Mo) (CN) Size <5 nm < <10000/μ³ |
|---|---|---|---|---|---|---|---|---|
| I1A | 50 | 5 | 45 | 43 | 0 | 7 | 50 | Yes |
| I1B | 40 | 10 | 30 | <u>57</u> | 0 | <u>3</u> | <u>15</u> | Yes |
| I1C | 60 | 45 | 15 | <u>25</u> | 0 | 15 | n.d. | Yes |
| I1D | <u>22</u> | <u>2</u> | 20 | 38 | 0 | <u>40</u> | 10 | Yes |
| I1E | <u>25</u> | 5 | 20 | 35 | 0 | <u>40</u> | 10 | Yes |
| I1F | <u>93</u> | <u>78</u> | 15 | <u>0</u> | 2 | 5 | 50 | Yes |
| I1G | 40 | <u>3</u> | 37 | 35 | 0 | <u>25</u> | <u>70</u> | Yes |
| I1H | 40 | 0 | 40 | 25 | 2 | <u>33</u> | <u>80</u> | <u>No</u> |
| I2J | 40 | 5 | 35 | 45 | 0 | 15 | 60 | Yes |
| I3I | 70 | 30 | 40 | 15 | 0 | 15 | 55 | Yes |
| R1B | <u>95</u> | <u>81</u> | 14 | <u>3</u> | 0 | <u>2</u> | 5 | Yes |
| R2B | 60 | 30 | 30 | 40 | 0 | <u>0</u> | 10 | Yes |
| R3B | <u>75</u> | 45 | 30 | 25 | 0 | <u>0</u> | 10 | Yes |
| R3C | 60 | 30 | 30 | 38 | 0 | <u>2</u> | 15 | Yes |
| R4J | <u>25</u> | <u>0</u> | 25 | 40 | 0 | <u>35</u> | 60 | Yes |
| R5B | <u>50</u> | 25 | 25 | <u>50</u> | 0 | <u>0</u> | 5 | Yes |
| R5C | 45 | 23 | 22 | <u>47</u> | 0 | 8 | <u>7</u> | Yes |

Underlined values: not in accordance with the invention
n.d.: not determined martensite and lower bainite (M+BI) as well as low-carbide bainite (BFC). FIG. 2 shows, in the form of darker areas, fresh martensite (MF).

Figure 3:
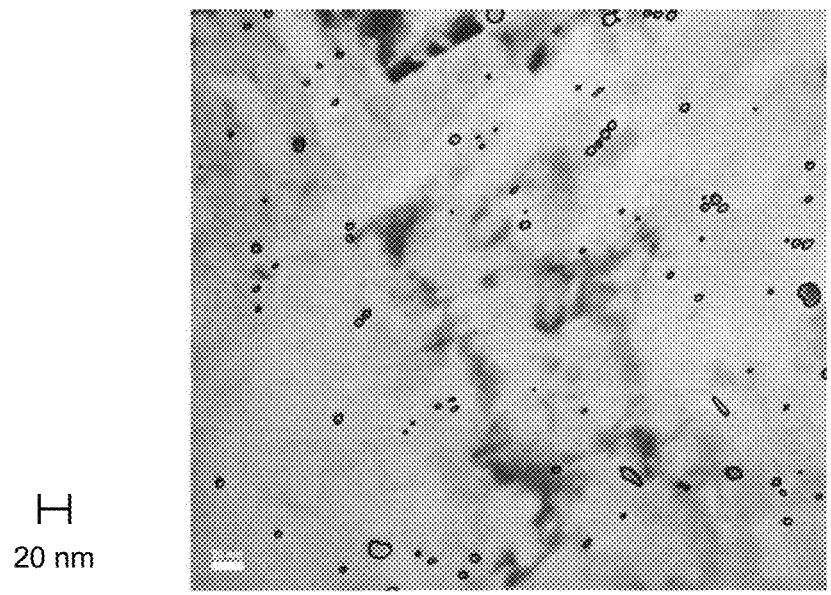
FIG. 3 shows an example of carbonitride precipitation of (Ti, Nb, Mo)(C, N) in a sheet according to the invention, observed through transmission electron microscopy.

In test I1A, the TEM observations (FIG. 3) reveal the presence of carbonitrides of (Ti, Nb, Mo)(CN) with an average size of 7 nm, in an amount less than 10,000 precipitates/µm³, such that the desired mechanical properties are achieved. These observations also reveal the presence of carbides in the form of rods oriented in directions <111> in the laths of auto-tempered martensite and lower bainite. Low-carbide bainite contains less than 100 carbides per 100 square micrometer unit of surface area.

In test I1B, the annealing temperature Tm is too close to AC3, which results in a low amount of carbon in the austenite. Excess low-carbide bainite forms during cooling and holding at the temperature Te. This results in insufficient mechanical strength.

In tests I1D and I1E, the heating rate $V_C$ is too low. Thus, excessive ferrite grain growth is observed. This leaves excess ferrite in the steel and there is insufficient martensite or lower bainite. The mechanical strength Rm is therefore not achieved even for holding times Dm of 60 s as is the case for example I1E.

In test I1F the cooling rate $V_R$ is too high. This results in excess martensite and lower bainite, and insufficient low-carbide bainite and fresh martensite. The mechanical strength and the yield strength are therefore far beyond the target values, while the elongation at break is insufficient.

The holding time Dm at temperature Tm for treatment G is too short such that the sheet produced according to condition I1G has a ferrite recrystallization rate less than 15%. This generates a banded structure that results in a hole expansion value that is too low.

Figure 4:
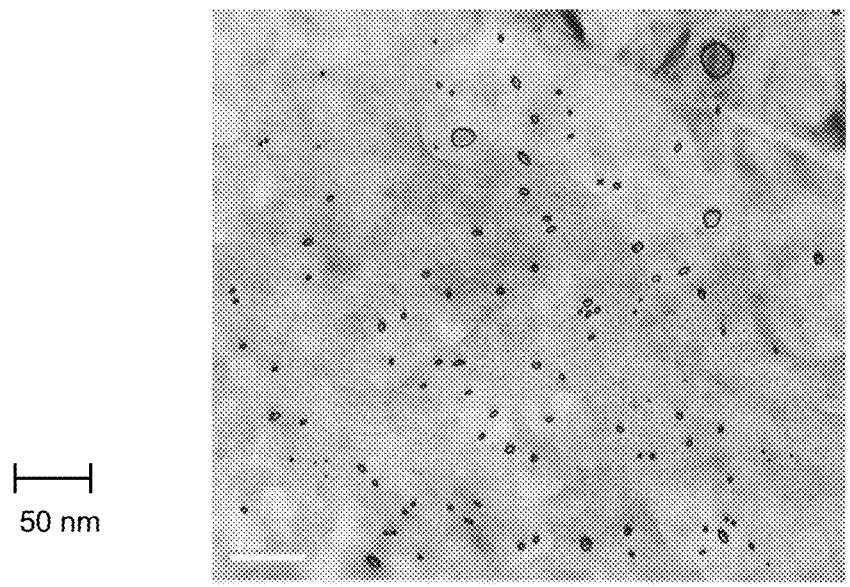
FIG. 4 shows an example of carbonitride precipitation of (Ti, Nb, Mo)(C, N) not according to the invention, observed through transmission electron microscopy.

In test I1H, the annealing temperature is too low, resulting in an excessively high density of small precipitates: the TEM observations (FIG. 4) show an average size of 5 nm in an amount greater than 10,000 precipitates/µm³ so that the mechanical resistance exceeds 1320 MPa. Furthermore, the low annealing temperature Tm makes it impossible to achieve a recrystallization rate of ferrite greater than 15%, which results in a hole expansion value that is too low.

In tests I1G and I1H, the fraction of austenitic grains wherein the size is less than 1 µm is too high, resulting in a temperature Ms that is too low and therefore the formation of an amount of bainite plus auto-tempered martensite that is too low. This contributes to reducing the hole expansion, which is too small for these two tests.

The sheet according to example R1B has C, Cr, Ti, and B contents that are too high, so that its mechanical strength Rm is too high despite a low amount of Mo. Thus, although a satisfactory yield strength Re is obtained, it is obtained in conjunction with a mechanical strength Rm that is too high.

Test sheets R2B, R3B, and R3C contain insufficient levels of C and Mn and Mo, and therefore do not have a satisfactory mechanical strength although the amounts of B and Cr are very high.

Example R5 has insufficient Mn content, which results in excess formation of low-carbide bainite in treatments B and C.

Steel sheets according to the invention may be used advantageously for manufacturing structural or safety parts in the automotive industry.

The invention claimed is:

1. A cold-rolled and annealed steel sheet comprising:
a thickness between 0.7 mm and 2 mm;
a mechanical strength between 1180 MPa and 1320 MPa;
a hole expansion ratio Ac % greater than 20%;
a bending angle greater than or equal to 40°;
a chemical composition comprising, the contents being expressed as weight percent:
0.09%≤C≤0.11%;
2.6%≤Mn≤2.8%;
0.20%≤Si≤0.55%;
0.25%≤Cr≤0.5%;
0.025%≤Ti≤0.040%;
0.0015%≤B≤0.0025%;
0.005%≤Al≤0.18%;
0.08%≤Mo≤0.15%;
0.020%≤Nb≤0.040%;
0.002%≤N≤0.007%;
0.0005%≤S≤0.005%;
0.001%≤P≤0.020%;
Ca≤0.003%; and
a remainder being iron and inevitable impurities arising from processing;
a microstructure of the steel sheet comprising martensite or lower bainite, the martensite comprising fresh martensite or auto-tempered martensite, a sum of surface fractions of martensite and lower bainite being from 40% to 70%, from 15% to 45% of a surface fraction of low-carbide bainite, from 5% to less than 20% of a surface fraction of ferrite, a non-recrystallized ferrite fraction of a total ferrite fraction being less than 15%, and less than 5% as a surface fraction of residual austenite in the form of islands, a fraction of former austenitic grains in which a size is less than at least one micrometer representing 40% to 60% of a total population of the former austenitic grains.

2. The steel sheet according to claim 1, wherein the microstructure comprises from 15% to 45% of the surface fraction of fresh martensite.

3. The steel sheet according to claim 1, wherein the microstructure comprises from 5% to 50% in surface fraction of the sum of auto-tempered martensite and lower bainite.

4. The steel sheet according to claim 3, wherein the auto-tempered martensite and the lower bainite contain carbides in a form of rods oriented in directions <111> of martensitic and bainitic laths.

5. The steel sheet according to claim 1, wherein the low-carbide bainite contains fewer than 100 carbides per 100 square micrometer unit of surface area.

6. The steel sheet according to claim 1, wherein the microstructure includes precipitates of the type (Ti, Nb, Mo)(C, N) of less than 5 nanometers in size, present in an amount of less than 10,000 precipitates/µm³.

7. The steel sheet according to claim 1, wherein the chemical composition comprises, the content being expressed as weight percent: 2.6%≤Mn≤2.7%.

8. The steel sheet according to claim 1, wherein the chemical composition comprises, the content being expressed as weight percent: 0.30%≤Si≤0.5%.

9. The steel sheet according to claim 1, wherein the chemical composition comprises, the content being expressed as weight percent: 0.005%≤Al≤0.030%.

10. The steel sheet according to claim 1, further comprising a zinc or zinc alloy coating obtained by hardening.

11. The steel sheet according to claim 10, wherein the zinc or zinc alloy coating is a galvanized-alloyed coating, the zinc or zinc alloy coating comprising from 7 wt-% to 12 wt-% iron.

12. The steel sheet according to claim 1, wherein the sheet comprises a zinc or zinc alloy coating obtained by vacuum deposition.

13. A method for manufacturing a cold-rolled and annealed sheet, comprising the steps of:
supplying a semi-finished product, a chemical composition comprising, the contents being expressed as weight percent:
0.09%≤C≤0.11%;
2.6%≤Mn≤2.8%;
0.20%≤Si≤0.55%;
0.25%≤Cr≤0.5%;
0.025%≤Ti≤0.040%;
0.0015%≤B≤0.0025%;
0.005%≤Al≤0.18%;
0.08%≤Mo≤0.15%;
0.020%≤Nb≤0.040%;
0.002%≤N≤0.007%;
0.0005%≤S≤0.005%;
0.001%≤P≤0.020%;
Ca≤0.003%; and
a remainder being iron and inevitable impurities arising from processing, then
heating the semi-finished product at a temperature Tr greater than or equal to 1250° C.; then
hot-rolling the semi-finished product, a finish temperature of the rolling being greater than a temperature Ar3 at which austenitic transformation starts during cooling, to obtain a hot-rolled sheet, then
cooling the hot-rolled sheet at a rate greater than 30° C./s to prevent the formation of ferrite and pearlite; then
coiling the hot-rolled sheet at a temperature between 580° C. and 500° C., then
cold-rolling the hot-rolled sheet to obtain a cold-rolled sheet, then
heating the cold-rolled sheet between 600° C. and Ac1, Ac1 being a temperature at which austenitic transformation starts during heating, at a heating rate $V_C$ between 1° C./s and 20° C./s, then
bringing the cold-rolled sheet to a temperature Tm between 780° C. and (Ac3-25° C.), and holding the cold-rolled sheet the temperature Tm for a period of time Dm between 30 seconds and 150 seconds, Ac3 being a finish temperature of austenitic transformation during heating, then
cooling the sheet at a rate VR1 between 10° C. and 150° C./s to a temperature Te between 400° C. and 490° C., then
holding the sheet at the temperature Te for a period of time De between 5 seconds and 150 seconds, then
continuously hot-dip coating the sheet by immersion in a zinc or zinc alloy bath at a temperature TZn between 450° C. and 480° C., the temperatures Te and TZn being such that 0° C.≤(Te−TZn)≤10° C. so as to obtain a coated sheet thereby producing the cold-rolled and annealed steel sheet of claim 1.

14. The method for manufacturing a cold-rolled and annealed sheet according to claim 13, further comprising the step of heating the coated sheet at a temperature $T_G$ between 490° C. and 550° C. for a period of time $t_G$ between 10 s and 40 s.

15. A method for manufacturing a cold-rolled and annealed sheet, comprising the following sequential steps:
supplying a semi-finished product, the chemical composition comprising, the contents being expressed as weight percent:
0.09%≤C≤0.11%;
2.6%≤Mn≤2.8%;
0.20%≤Si≤0.55%;
0.25%≤Cr≤0.5%;
0.025%≤Ti≤0.040%;
0.0015%≤B≤0.0025%;
0.005%≤Al≤0.18%;
0.08%≤Mo≤0.15%;
0.020%≤Nb≤0.040%;
0.002%≤N≤0.007%;
0.0005%≤S≤0.005%;
0.001%≤P≤0.020%;
Ca≤0.003%; and
the remainder being iron and inevitable impurities arising from processing;
heating the semi-finished product at a temperature $T_r$ greater than or equal to 1250° C.;
hot-rolling the semi-finished product, a finish temperature for rolling being greater than Ar3, to obtain a hot-rolled sheet; then
cooling the hot-rolled sheet at a rate greater than 30° C./s to prevent formation of ferrite and pearlite; then
coiling the hot-rolled sheet at a temperature between 580° C. and 500° C.; then
cold-rolling the hot-rolled sheet to obtain a cold-rolled sheet; and then
reheating the cold-rolled at a re-heating rate VR, between 600° C. and Ac1, Ac1 being a temperature at which austenitic transformation starts during heating, between 1° C./s and 20° C./s, then
reheating the cold-rolled sheet to a temperature Tm between 780° C. and (Ac3-25° C.), and holding the cold-rolled sheet at a temperature Tm for a period of time Dm between 30 seconds and 150 seconds, Ac3 being a finish temperature of austenitic transformation during heating, then
cooling the sheet at a rate VR2 between 10° C./s and 100° C./s to a temperature Te between 400° C. and 490° C., then
holding the sheet at a temperature Te for a period of time De from 5 seconds to 150 seconds, then
cooling the sheet to room temperature thereby producing the cold-rolled and annealed steel sheet of claim 1.

16. The method for manufacturing a sheet according to claim 15, further comprising the step of
applying a zinc or zinc alloy coating by vacuum deposition after the step of cooling the sheet to room temperature.

17. The method for manufacturing a sheet according to claim 16, wherein the said vacuum deposition is carried out by physical vapor deposition (PVD).

18. The method for manufacturing a sheet according to claim 16, wherein the vacuum deposition is carried out by Jet Vapor Deposition (JVD).

19. A structural or safety part for a motor vehicle comprising:
the steel sheet according to claim 1 formed into a part.

20. A structural or safety part for a motor vehicle manufactured by the method according to claim 13.

21. A structural or safety part for a motor vehicle manufactured by the method according to claim 15.

* * * * *